United States Patent [19]

Tiku

[11] Patent Number: 4,760,369
[45] Date of Patent: Jul. 26, 1988

[54] THIN FILM RESISTOR AND METHOD
[75] Inventor: Shiban K. Tiku, Richardson, Tex.
[73] Assignee: Texas Instruments Incorporated, Dallas, Tex.
[21] Appl. No.: 769,209
[22] Filed: Aug. 23, 1985
[51] Int. Cl.⁴ ............................................. H01C 1/012
[52] U.S. Cl. ................... 338/308; 204/192.11; 437/8
[58] Field of Search .................. 420/417, 427, 431; 338/22 SP, 308, 309; 427/82, 83, 93

[56] References Cited
U.S. PATENT DOCUMENTS

| | | | |
|---|---|---|---|
| 4,063,211 | 12/1977 | Yasujima et al. | 338/308 |
| 4,217,570 | 8/1980 | Holmes | 338/308 |
| 4,288,776 | 9/1981 | Holmes | 338/308 |
| 4,343,986 | 8/1982 | Mitani et al. | 338/309 X |
| 4,392,992 | 7/1983 | Paulson et al. | 338/309 X |
| 4,609,903 | 9/1986 | Toyokura et al. | 338/22 SD |

Primary Examiner—E. A. Goldberg
Assistant Examiner—M. M. Lateef
Attorney, Agent, or Firm—Carlton H. Hoel; Leo N. Heiting; Melvin Sharp

[57] ABSTRACT

Thin film resistors formed from a metal silicon nitride film are provided in which tungsten, titanium, tantalum, and other group IV A, V A, and VII A metals are included. The silicon to metal ratio varying between about 0.1 and 10.0 and the nitrogen to metal ratio varying between about 0.1 and 10.0 provide sheet resistances which include the useful range of about 100 to over 10,000 ohms per square for films approximately 2,000 angstroms thick. Deposition of these materials by sputtering a metal silicide target in a nitrogen containing atmosphere, such as 20% nitrogen and 80% argon is also provided.

19 Claims, 3 Drawing Sheets

THIN FILM RESISTOR AND METHOD

BACKGROUND OF THE INVENTION

The presnet invention relates to electronic devices, and, more particularly, to thin film resistors for thin film devices and intergrated circuits.

Thin film devices and integrated circuits frequently require resistors as part of the circuitry, and thin film resistors, along with diffused and implanted resistors and polysilicon resistors, are typically the form of resistor used. Thin film resistors basically consist of a thin film of resistive material on a layer of insulating material with end contacts on the resistive material. See, generally, Glaser and Subak-Sharpe, Integrated Circuit Engineering, ch. 4 (Addison-Wesley, 1977).

Implanted and diffused resistors generally have a large temperature coefficient of resistance ("TCR") and cannot be trimmed like thin film resistors (such as by anodization which makes the film thinner or by laser removal of a portion of the film). Further, implanted resistors are apparently reproducible in silicon with sheet resistances up to 5,000 $\Omega/\square$, but for gallium arsenide the material reproducibility and surface depletion layers provide additional limitations on implanted resistors. In contrast, thin film resistors with nichrome (20% chromium and 80% nickel) as the resistive material have a TCR in the order of 100 ppm/°C. and sheet resistances in the range of 10 to 400 $\Omega/\square$.

Thin film resistors can be fabricated in various geometric patterns, such as a meander, to increase resistance for a given area occupied, and the film thickness can be reduced to also increase resistance. However, as the device density increases and the design rules decrease for very large scale integration circuits, patterns are not feasible and the film thickness required for materials such as nichrome is too small to be practical. Thus there is a need for high resistivity materials with low TCR to use in thin film resistors.

Various materials with low TCR and high resistivity are available and include chromium silicide (24% chromium), chromium titanium (35% chromium), chromium silicon oxide (70% chromium), and stannic oxide; see K. Chopra and I. Kaur, Thin Film Device Applications (Plenum Press 1983). Of these materials, the cermet of chromium and silicon oxide is the most useful for large value resistors; however, this cermet is deposited by flash evaporation which leads to reproducibility problems and must be etched by ion milling. Sputtering deposition of this cermet is also possible, but the variability of target material leads to even greater reproducibilty problems than flash evaporation. Thus there is a need for high resistivity material with low TCR which can be deposited in a reproducible process and which can be easily etched and trimmed.

SUMMARY OF THE INVENTION

The present invention provides thin film resistors with the resistive film material a metal silicon nitride together with methods of fabrication of sputtering metal silicide in nitrogen containing atmosphere; the fraction nitrogen in the sputtering atmosphere may be varied to adjust the sheet resistance of the resistive film. Metals from Groups IV A, V A, and VI A appear suitable. Preferred embodiments include $MSi_xN_y$ with M denoting a metal such as tungsten, titanium, tantalum, or an alloy of them and with x,y within an order of magnitude of 1. Preferred embodiment methods include sputtering metal silicide targets in an argon-nitrogen atmosphere with the ratio of nitrogen to argon determining the sheet resistance which may be in the convenient range of 100 to 10,000 $\Omega/\square$ for films of 2,000 Å thickness.

These materials provide high sheet resistance with moderate film thicknesses, ease of processing as by plasma etching, reproducibility of resistance, trimmability by laser, simple target materials, simple adjustment of sheet resistance, and low temperature coefficient of resistance and solve the problems of known thin film resistive materials.

DESCRIPTION OF THE PREFERRED EMBODIMENTS

Figure 1:
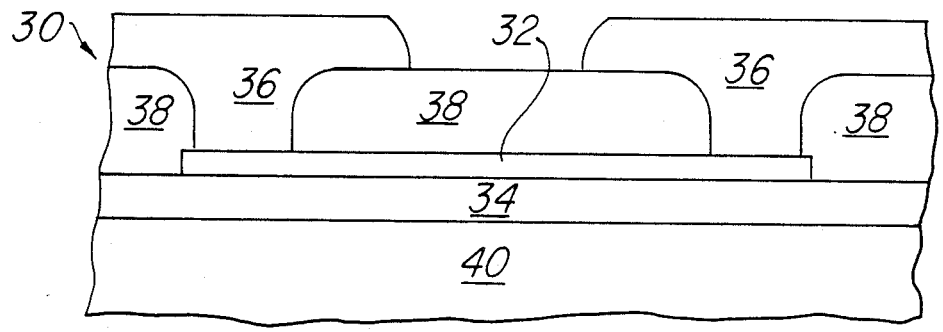
FIG. 1 is a schematic cross sectional elevation view of a first preferred embodiment thin film resistor.

A first preferred embodiment thin film resistor, generaly denoted 30, is illustrated in cross sectional elevation view in FIG. 1 and includes tungsten silicon nitride film 32, silicon dioxide insulating layer 34, end contacts 36, and silicon dioxide insulator 38, all situated on gallium arsenide substrate 40. Film 32 is 2,000 Å thick and has a composition of $WSi_xN_y$ with x=0.8, y=1; this thickness and composition yields a sheet resistance of about 600 $\Omega/\square$ and a low temperature coefficient of resistance (about 200–300 ppm/°C.). Silicon dioxide insulating layer 34 is 3,000 Å thick, and film 32 has good adhesion to silicon dioxide. End contacts 36 are made of aluminum or Ti-W/Au. Further characteristics of resistor 30 can best be described by consideration of the first preferred embodiment method of fabrication, which includes the following steps.

(a) Silicon dioxide is deposited by LPCVD onto gallium arsenide substrate 40 to a thickness of 3,000 Å. This will eventually form insulating layer 34.

Figure 2:
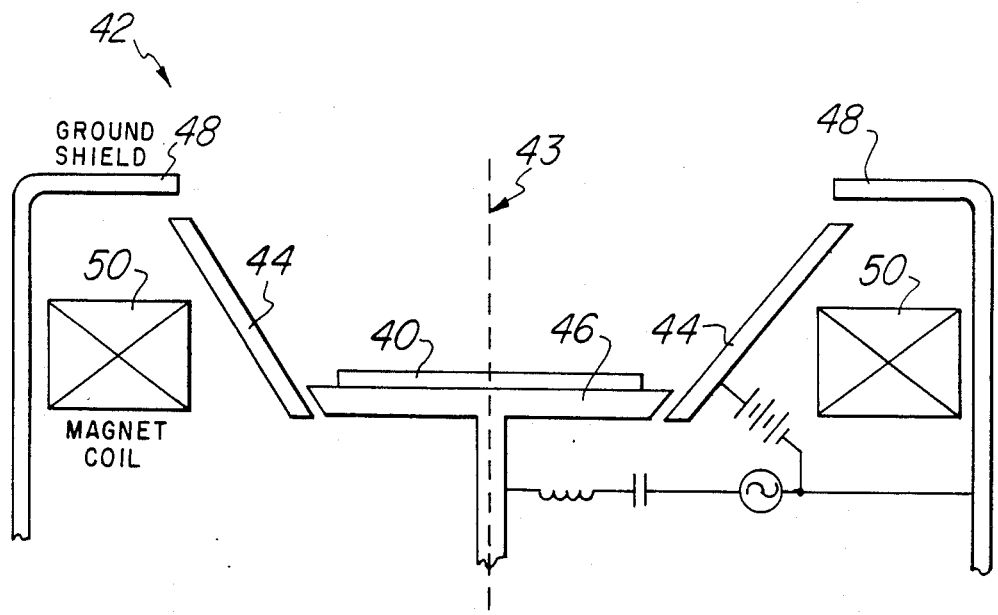
FIG. 2 illustrates a first preferred embodiment method of deposition.

(b) Oxide layered substrate 40 is put into magnetron sputterer 42 with a composite sintered target 44 made of $W_5Si_3$; see FIG. 2 which illustrates schematically sputterer 42 in cross sectional elevation (note that sputterer 42 is axial symmetric about axis 43). A gas mixture of 80% argon and 20% nitrogen is flowed through sputterer 42 at 10 sccm and with a total pressure of 10 millitorr. The gas is excited into a plasma and sputter deposits 2,000 Å of $WSi_{0.8}N$ in about twenty minutes. The sputtering occurs as follows: an RF voltage is applied across anode 46 and ground shield 48 to establish a glow discharge, and the crossing electric and magnetic (generated by coil 50) fields constrain the plasma electrons to long helical orbits in the gas so that the electrons ionize the gas. Cathode target 44 is biased negative, and the argon ions bombard target 44 to eject the tungsten and silicon; note that the silicon is more effectively ejected to despite the 5 to 3 ratio of tungsten to silicon in the target, the ratio of tungsten to silicon in film 32 is approximately 1 to 0.8. The ejected tungsten and silicon plus nitrogen supplied by the gas then deposit on substrate 40 to form the $WSi_{0.8}N$ layer.

(c) Layered substrate 40 is removed from sputterer 42, and the layer of WSi$_{0.8}$N is patterned and plasma etched with CF$_4$+O$_2$ to form resistive film 32. Note that this plasma etch is a standard etch for etching silicon nitride and etches WSi$_8$N at rate of a few hundred Å per minute. Then an oxide layer is deposited, patterned, and vias etched with CHF$_3$+O$_2$ to form insulating layer 34; note that this plasma etch only etches film 32 at a rate of about 60 Å per minute but etches oxide at 300–400 Å per minute, so stopping the etch at film 32 is practical.

(d) Lastly, end contacts 36 are formed by sputter deposition; film 32 is stable under contact alloying and bonding conditions and can be trimmed by laser removal. This completes resistor 30.

Figure 3:
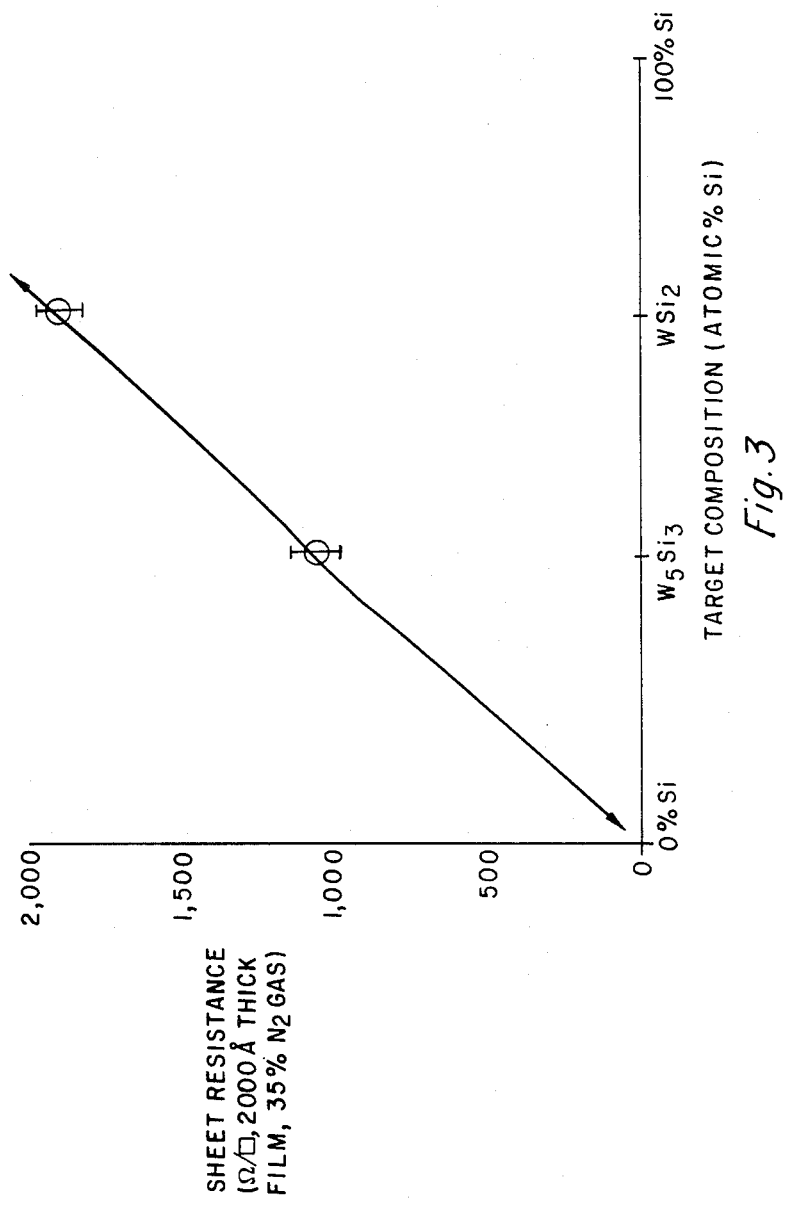
FIGS. 3 and 4 graphically illustrate the dependence of sheet resistance upon deposition parameters.

The deposition conditions for film 32 of resistor 30 may be varied to adjust the film's composition and thus sheet resistance. In particular, both the composition of target 44 and the mixture of the gas are easily changed and still permit reproducible film sheet resistance. Further, adjustability of sheet resistance by the gas mixture can compensate for a lack of reproducibility in available target composition. In other words, if during a production run one target is replaced with another, then the first resistors fabricated with the new target can be measured and any deviation from the resistors fabricated with the old target can be compensated for by an adjustment of the gas mixture. In particular, FIG. 3 illustrates the dependence of the sheet resistance on the composition of the target for a film of thickness of 2,200 Å deposited in a gas mixture of 7.5 millitorr argon and 1.5 millitorr nitrogen. Observe that W N of this thickness has a sheet resistance of about 15 $\Omega/\square$ and as the silicon content increases the sheet resistance increases to about 1,800 $\Omega/\square$ for WSi$_x$N$_y$ with x approximately 2.5 and y approximately 2. The sheet resistance varies essentially continuously due to the amorphous nature of the tungsten silicon nitrides.

Figure 4:
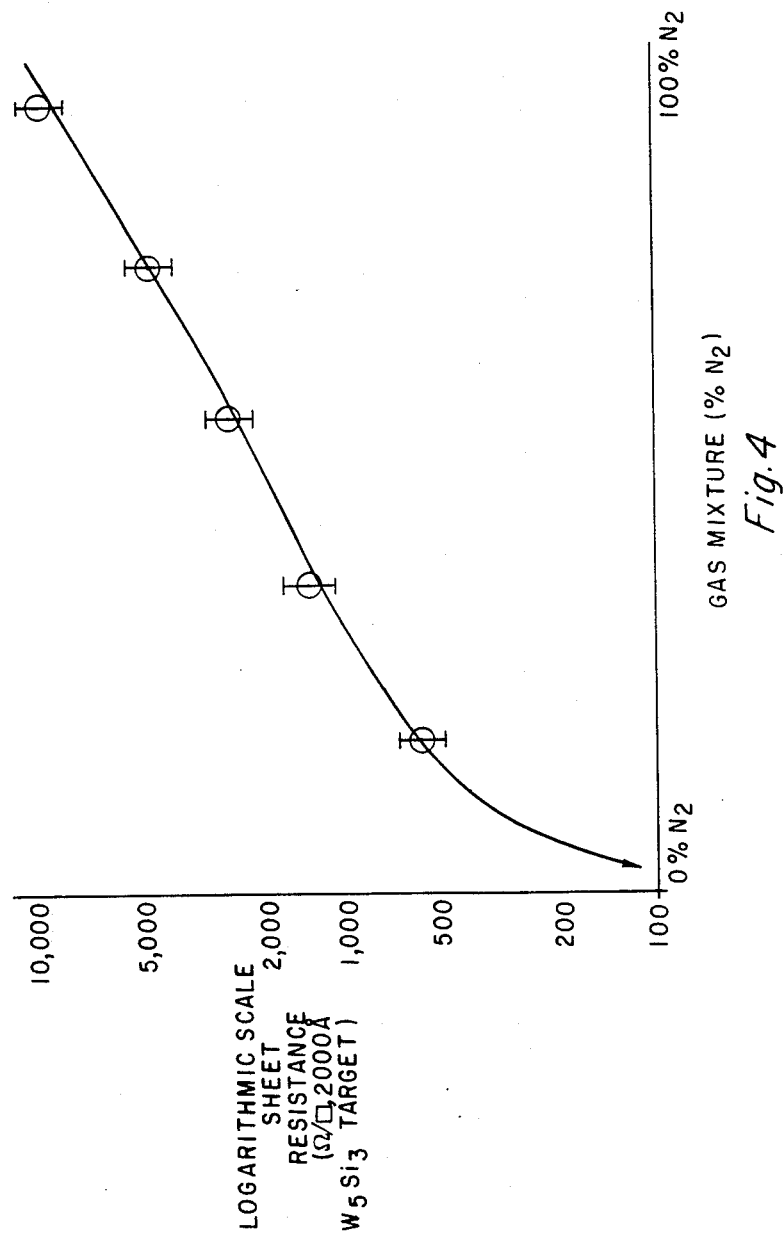

FIG. 4 illustrates the dependence of sheet resistance on the nitrogen content of the gas mixture for a film thickness of 2,200 Å and a W$_5$Si$_3$ target. Note that the sheet resistance is on a logarithmic scale and varies from below 100 $\Omega/\square$ for minimal nitrogen (i.e., tungsten disilicide has a sheet resistance at this thickness of about 5 $\Omega/\square$) to over 10,000 $\Omega/\square$ for close to 100% nitrogen. Of course, the argon ions in the plasma provide much of the sputtering ejection of the tungsten and silicon, so with higher nitrogen percentage the sputtering rate is lower. Note that the sensitivity of the sheet resistance on the nitrogen content is much higher at low nitrogen levels, but these levels correspond to sheet resistances in the range where nichrome is usable.

Figure 5:
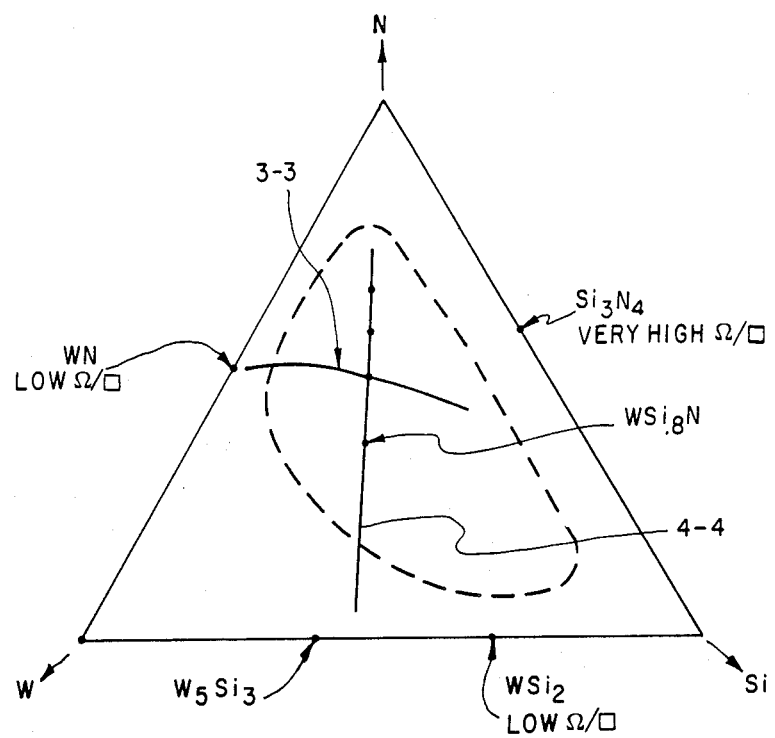
FIG. 5 is a composition diagram illustrating the dependence of sheet resistance upon composition.

FIG. 5 is a composition diagram which illustrates the sheet resistance variation with film composition. The diagram is interpreted as follows: each point in the triangle represents a compound with its atomic fraction nitrogen proportional to the distance from the triangle's bottom edge to the point, its atomic fraction silicon proportional to the distance from the triangle's left edge to the point, and its atomic fraction tungsten proportional to the distance from the triangle's right edge to the point. Thus, for example, pure tungsten is represented by the lower left hand corner of the triangle, and silicon nitride (Si$_3$N$_4$) by a point three sevenths of the way down the right edge from the top corner.

The variation of sheet resistance with film composition may generally be described in FIG. 5 by noting that sheet resistance decreases towards the lower left corner (increasing tungsten) and increases towards the right edge (decreasing tungsten). The variation represented by FIG. 4 corresponds to the line segment labelled 4—4 in FIG. 5, and the variation represented by FIG. 3 corresponds the line segment labelled 3—3. Thus the region indicated by the dashed line corresponds to expected useful sheet resistances. Note that metal silicide resistivities and metal nitride resistivities appear in S. Murarka, Silicides for VLSI Applications (Academic Press 1983), which is hereby incorporated by reference.

Second preferred embodiment resistor 130 is structurally similar to resistor 30, but resistor 130 has a resistive film 132 of TiSi$_x$N$_y$ which has properties comparable to film 32 but with lower resistance. The sheet resistance dependence of film 132 on target composition and gas mixture is similar to that illustrated in FIGS. 3 and 4; however, titanium based film 132 is etched faster in a CF$_4$+O$_2$ plasma than the tungsten based films 32.

Third preferred embodiment resistor 230 is also structurally similar to resistor 30, but resistor 230 has a resistive film 232 of TaSi$_x$N$_y$ which is also comparable to film 32. The sheet resistance dependence of film 232 on target composition and gas mixture is also similar to that illustrated in FIGS. 3 and 4. However, tantalum based film 232 is etched slower in a CF$_4$+O$_2$ plasma than the tungsten based films 32.

MODIFICATIONS AND ADVANTAGES

Various modifications, such as dimensions and geometries, of the preferred embodiment devices and methods may be made while retaining the features of metal silicon nitrides or the sputtering of a metal silicide target in a nitrogen containing atmosphere.

In particular, metal silicon nitrides for metals in the periodic table Groups IV A, V A, VI A, VII A, and VIII should give a wide range of useful films.

And, silicides of Group IV A, V A, and VI A metals and their alloys could be used as sputtering targets in atmospheres of nitrogen with various inert gases such as helium, neon, argon, krypton, and xenon or mixtures thereof. Also, sputtering with multiple targets can simulate alloy targets. Wide variation of pressure and flow rate of the gas mixture can be made while still yielding acceptable sputtering rates. Also, Group VII A and Group VIII metals may be useful.

The advantages of sheet resistance dependence upon the silicon and nitrogen to metal ratios includes simple adjustment of the sheet resistance while retaining reproducibility. And one target processes can be used since the nitrogen can be adjusted to compensate for variations in target composition. Also, resistances not available with known film materials with low TCR may be had. Further, the etchability of the metal silicon nitrides in standard plasma etches provides ease of processing.

I claim:
1. A thin film resistor material, comprising:
   (a) MSi$_x$N$_y$ with M a metal or alloy from periodic table Groups IV A, V A, VI A, VII A, or VIII and y is greater than (4/3)x.
2. The material of claim 1, wherein:
   (a) $0.1 \leq x \leq 10$.
3. The material of claim 2, wherein:
   (a) $0.1 \leq y \leq 10$.
4. The material of claim 1, wherein:
   (a) said M is selected from the group consisting of tungsten, tantalum, titanium, and alloys thereof.
5. A thin film resistor on a substrate, comprising:
   (a) an insulator on said substrate;

(b) thin film material on said insulator, said material of composition $MSi_xN_y$ with M a metal or alloy from periodic table Groups IV A, V A, VI A, VII A, or VIII, and y is greater than (4/3)x; and (c) electrical contacts to said thin film material.

6. The resistor of claim 5, wherein:
(a) $0.1 \leq x \leq 10$.

7. The resistor of claim 6, wherein:
(a) $0.1 \leq y \leq 10$.

8. The resistor of claim 5, wherein:
(a) said M is selected from the group consisting of tungsten, tantalum, titanium and alloys thereof.

9. A semiconductor integrated circuit, comprising:
(a) a semiconductor substrate with circuitry thereon, said circuitry including thin film resistors;
(b) wherein at least one of said thin film resistors includes:
  i. an insulator on said substrate;
  ii. thin film material on said insulator, said material of composition $MSi_xN_y$ with M a metal or alloy from periodic table Groups IV A, V A, VI A, VII A, or VIII, and y is greater than (4/3)x; and
  iii. electrical contacts to said thin film material.

10. The integrated circuit of claim 9, wherein:
(a) $0.1 \leq x \leq 10$;
(b) $0.1 \leq y \leq 10$;
(c) M is selected from the group consisting of tungsten, tantalum, titanium, and alloys thereof; and
(d) said insulator is silicon dioxide.

11. A thin film resistor on a gallium arsenide substrate, comprising:
(a) a silicon dioxide insulator on said substrate;
(b) thin film material on said insulator, said material of composition $MSi_xN_y$ with M a metal or alloy from specific periodic table groups IV A, V A, VI A, or VII A or VIII and y is greater than (4/3)x; and
(c) electrical contacts to said thin film material.

12. A semiconductor integrated circuit, comprising:
(a) a gallium arsenide substrate with circuitry thereon, said circuitry including thin film resistors;
(b) wherein at least one of said thin film resistors includes;
  i. a silicon dioxide insulator on said substrate;
  ii. thin film material on said insulator, said material of composition $MSi_xN_y$ with M a metal or alloy from periodic table groups IV A, V A, VI A, or VII A or VIII, and y is greater that (4/3)x; and
  iii. electrical contacts to said thin film material.

13. A method of deposition of a metal silicon nitride, comprising the step of:
(a) sputtering a metal silicide in a nitrogen containing atmosphere to form a material of composition $MSi_xN_y$ with M a metal or alloy from specific periodic table groups IV A, V A, VI A, VII A, or VIII and y is greater than (4/3)x.

14. The method of claim 13, wherein:
(a) said atmosphere essentially consists of nitrogen plus inert gasses.

15. The method of claim 14, wherein:
(a) said inert gasses are argon.

16. The method of claim 14, comprising the further step of:
(a) adjusting the ratio of nitrogen to inert gas.

17. A process of fabricating a thin film resistor of a preselected resistance on each of a sequence of substrates, comprising the steps of:
(a) sputtering a metal silicide target in a nitrogen containing atmosphere to deposit a metal silicon nitride film on a first of said substrates, said film comprising a material of composition $MSi_xN_y$ with M a metal or alloy from specific periodic table groups IV A, V A, VI A, VII A or VIII and y is greater than (4/3)x;
(b) patterning and etching said metal silicon nitride film to form said resistor on said first substrate;
(c) measuring the resistance of said resistor and comparing this to said preselected resistance;
(d) adjusting the fraction of nitrogen in said atmosphere to adjust the resistivity of said metal silicon nitride film deposited by step (a) to yield said preselected resistance by step (b);
(e) repeating steps (a) and (b) for the remaining of said substrates.

18. The process of claim 17, wherein:
(a) said metal silicide target is a compound of tungsten and silicon.

19. The process of claim 17, wherein:
(a) said atmosphere is a mixture of nitrogen and argon.

* * * * *